United States Patent [19]

Nakao et al.

[11] Patent Number: 5,667,942
[45] Date of Patent: Sep. 16, 1997

[54] RESIST PATTERN FORMING METHOD

[75] Inventors: Yoshiyuki Nakao; Minoru Hirose, both of Kawasaki, Japan

[73] Assignee: Fujitsu Limited, Kawasaki, Japan

[21] Appl. No.: 683,525

[22] Filed: Jul. 15, 1996

Related U.S. Application Data

[63] Continuation of Ser. No. 319,222, Oct. 6, 1994, abandoned.

[30] Foreign Application Priority Data

Dec. 28, 1993 [JP] Japan ................................ 5-337433

[51] Int. Cl.⁶ ............................................ G03F 7/00
[52] U.S. Cl. ............................ 430/327; 430/325; 430/330
[58] Field of Search ................................ 430/311, 325, 430/327, 330

[56] References Cited

FOREIGN PATENT DOCUMENTS 52-58374  5/1977  Japan.
59-182442  10/1984  Japan.
4-172461  6/1992  Japan.

*Primary Examiner*—Kathleen Duda
*Attorney, Agent, or Firm*—Nikaido Marmelstein Murray & Oram LLP

[57] ABSTRACT

A resist pattern forming method which includes:
- an application step of applying a photoresist onto a semiconductor substrate,
- a prebake step of prebaking the photoresist in an atmosphere containing water vapor following the application of the photoresists to the substrate,
- an exposure step of exposing the photoresist to radiation following the prebake step,
- a heating step of heating the photoresist following the exposure step, and
- a development step of developing the photoresist following the heating step, whereby a large amount of water is imparted to and is therefore present in the resist film so as to obtain high dissolving speed of the exposed part of the resist into the developer, with the result of improving the resist sensitivity.

12 Claims, No Drawings

RESIST PATTERN FORMING METHOD

This application is a continuation of application Ser. No. 08/319,222 filed Oct. 6, 1994, now abandoned.

BACKGROUND OF THE INVENTION

The present invention relates to a resist pattern forming method for forming a resist pattern in a lithographic step in a semiconductor device fabrication process.

With LSI higher integration, recently more micronization of circuit patterns are required.

The present micronized pattern forming techniques depend mainly upon light exposure techniques. In the light exposure techniques, with improved efficiency of light exposure apparatuses, higher resist resolving powers have been achieved.

Resist developing treatments are conducted so far dominantly by the wet developing method in which wafers are exposed to developers. This method uses a difference in solution speed between an exposed part of a resist and a non-exposed part thereof. In the case of a positive-type resist, its exposed part is dissolved, whereas its non-exposed part is left. In the case of a negative-type resist, its non-exposed part is dissolved, whereas its exposed part is left.

As the prior methods for forming a pattern of such positive-type resist there have been published, a method comprising the step of heat-treating an exposed film in an atmosphere containing water vapor, at 80°–100° C. for a few to 10 minutes (Japanese Patent Laid-Open Publication No. Sho 52-58374/1977); a method comprising the step of heat-treating an exposed photoresist film in an atmosphere containing water vapor, and the step of developing the photoresist (Japanese Patent Laid-Open Publication No. Hei 04-172461/1992); and a method comprising the step of leaving a substrate for a certain period of time in a humidity-controlled atmosphere to make the water-content of a resin film substantially constant, and the step of irradiating energy beams selectively in a required configuration to develop the film (Japanese Patent Laid-Open Publication No. Sho 59-182442/1984).

The usually generally used positive-type resists are made of novolak resin, and naphthoquinonediazido photosensitizers. Their chemical reaction is this.

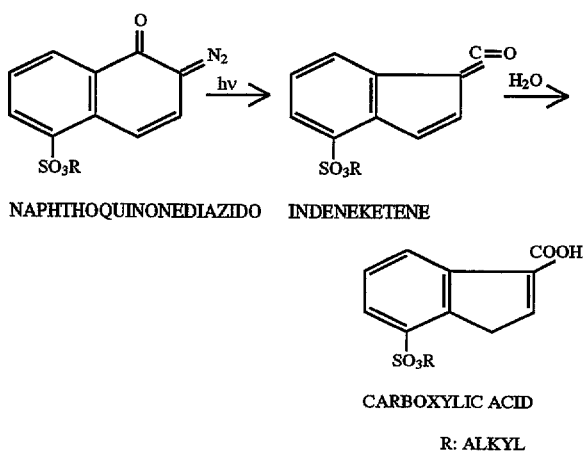

NAPHTHOQUINONEDIAZIDO   INDENEKETENE

CARBOXYLIC ACID

R: ALKYL

When UV radiation (hv) is applied to naphthoquinonediazido, which is insoluble in alkaline developers, the naphthoquinonediazido is photochemically changed into indeneketene. Indeneketene has a short lifetime and quickly reacts with water ($H_2O$), which is present in the resist film, into carboxylic acid. Because carboxylic acid is soluble in alkaline developers, the exposed part is dissolved, the non-exposed part remains, and a resist pattern thus formed.

Then it is seen that the amount of the carboxylic acid generated in the exposed part is related to the amount of the water in the resist film. That is, it can be said that the larger the amount of water in the resist film, the larger the amount of carboxylic acid is generated. With a larger amount of carboxylic acid, a solution speed for the exposed part to be dissolved into the developer is higher, in other words, the resist has a higher sensitivity.

But the amount of the water in the resist film has not been controlled, and accordingly improvement of the sensitivity of the resist film has not been expected by methods other than control of the composition (the polarity, the molecular weight distribution, the structure of the sensitizer, etc. of the resin) of the resist. This has been a problem.

SUMMARY OF THE INVENTION

The present invention has been made in view of the above-described problem. An object of the present invention is to provide a resist pattern forming method which controls the water content in a resist film for improvement of sensitivity of the resist.

The above-described object of the present invention is achieved by a resist pattern forming method comprising: an application step of applying a photoresist onto a semiconductor substrate; a prebake step of prebaking the photoresist in an atmosphere containing water vapor after the application step; an exposure step of exposing the photoresist to radiation after the prebake step; a heating step of heating the photoresist after the exposure step; and a development step of developing the photoresist after the heating step.

In the above-described resist pattern forming method, it is preferable that an atmosphere containing water vapor comprises a mixed gas of steam and nitrogen.

In the above-described resist pattern forming method, it is most preferable that an atmosphere containing water vapor comprises a mixed gas of steam and nitrogen mixed in a 1:2–1:6 ratio.

In the above-described resist pattern forming method, it is preferable that an atmosphere containing water vapor is generated by feeding said mixed gas into operating proximity to the resist being exposed thereto at a 300–1200 sccm flow rate.

In the above-described resist pattern forming method, it is preferable that the prebake is a heating treatment at 90°–110° C. for 30–120 seconds.

In the above-described resist pattern forming method, it is preferable that the photoresist is a positive-type resist.

In the above-described resist pattern forming method, it is preferable that the photoresist includes a naphthoquinonediazido photosensitizer.

According to the present invention, the resist pattern forming method comprises the application step of applying a photoresist onto a semiconductor substrate; the prebake step of prebaking the photoresist in an atmosphere containing water vapor following the application of the photoresist; the exposure step of exposing the photoresist to suitable radiation following the prebake step; the heating step of heating the photoresist following the exposure step; and the development step of developing the photoresist following the heating step, whereby a large amount of water is imparted into the resist film, so as to obtain high dissolving speed of the exposed part into a developer, with a result of improved resist sensitivity.

DETAILED DESCRIPTION OF THE INVENTION

The resist pattern forming method according to the present invention will be explained in detail.

First, a semiconductor substrate (Si) is subjected to HMDS (hexamethyldisilanzane) treatment by exposing the surface to HMDS atmosphere for 20 seconds.

Then, the semiconductor substrate is spin-coated with a highly sensitive i-ray positive-type resist as a photoresist.

Next, the film of the photoresist is prebaked in an atmosphere containing water vapor generated by a supersonic vaporizer under conditions sufficient to evaporate the solvent in the photoresist film to an extent sufficient to harden the photoresist and improve the adhesion of the photoresist film to the semiconductor substrate.

That is, the prebake following the applying of the photoresist is conducted in an atmosphere containing water vapor, so that a large amount of water is imparted to and therefor becomes present in the resist film for high solution speed of an exposed part into developer, with a result of high resist sensitivity.

In the present example, the atmosphere is generated by feeding a mixed gas of steam and nitrogen in a 1:4 ratio at a 900 sccm flow rate into proximity to the resist film. The prebaking is conducted by heating on a hot plate at 110° C. for 90 seconds.

Subsequently the prebaked photoresist film is UV-exposed using an i-rays stepper in which a projection optical system has a NA (numerical aperture) of 0.54.

Then the exposed photoresist is heated for PEB (Post Exposure Bake) for 60 minutes on a hot plate at 110° C.

Then the photoresist is subjected to puddle development for 70 minutes with an alkaline developer (TMAH: tetramethylammonium hydroxide, 2.38% aq), and an intended resist pattern is formed.

For comparison with the resist forming method according to the above-described example, the same photoresist was prebaked in a nitrogen atmosphere without steam content, and then the exposure and development at the same conditions as in the above-described example were conducted, and a resist pattern as a control was prepared.

In comparison between the example and the control in resist sensitivity, the example required 60 mJ/cm$^2$, and the control required 70 mJ/cm$^2$. It was confirmed that the sensitivity of the embodiment was improved by about 14% with respect to that of the control.

In the resist pattern forming method according to the present invention, the prebaking may be conducted at other conditions than the above-described example. For example, the atmosphere may be generated by feeding the mixed gas of steam and nitrogen in a 1:2–1:6 ratio at a 300–1200 sccm flow rate, and the prebaking may be conducted by heating on a 90°–110° C. hot plate for 30–120 seconds.

As described above, the prebake following the applying of the photoresist is conducted in an atmosphere containing water vapor, so that a large amount of water is imparted to and therefor is present in the resist film for high solution speed of an exposed part into a developer, with a result of high resist sensitivity.

Accordingly with drastically improved resist sensitivity in comparison with the conventional prebake method, exposure and development times are shortened, and thus productivity is accomplished.

What is claimed is:

1. A positive resist pattern forming method comprising:

applying a photoresist, containing groups which generate carboxylic acid upon irradiation thereof, onto a semiconductor substrate;

pre-baking the photoresist disposed on said semiconductor substrate, prior to exposing said photoresist to carboxylic acid generating irradiation, in an atmosphere containing water vapor, following the application step;

exposing said pre-baked photoresist to irradiation under conditions sufficient to form carboxylic acid groups in said photoresist;

heating the carboxylic acid containing photoresist following the exposure step; and developing the photoresist to remove the irradiated portions thereof following the heating step;

wherein said step of pre-baking in said atmosphere containing water vapor is carried out under conditions sufficient to cause an increase in the amount of water in said pre-baked photoresist prior to said heating step, as compared to the amount of water which would have been in the same photoresist pre-baked under the same conditions but in the absence of said water vapor in said atmosphere during said pre-baking also prior to said heating step;

wherein said atmosphere during baking has sufficient water vapor content, and is contacted with said resist coated semiconductor during pre-baking thereof under such conditions, as to increase the amount of water in said resist during exposure to said radiation; and wherein said increased amount of water in said pre-baked photoresist is sufficient to cause an increase in the speed of dissolution of a portion of said pre-baked photoresist which had been exposed to said irradiation.

2. A resist pattern forming method according to claim 1, wherein the atmosphere comprises a mixed gas of steam and nitrogen.

3. A resist pattern forming method according to claim 2 wherein the photoresist comprises a naphthoquinone diazide photosensitizer.

4. A resist pattern forming method according to claim 2, wherein the atmosphere comprises a mixed gas of steam and nitrogen mixed in a 1:2–1:6 ratio.

5. A resist pattern forming method according to claim 4 wherein the photoresist comprises a naphthoquinone diazide photosensitizer.

6. A resist pattern forming method according to claim 4, including feeding said atmosphere into effective contact with said resist at a 300–1200 sccm flow rate.

7. A resist pattern forming method according to claim 6 wherein the photoresist comprises a naphthoquinone diazide photosensitizer.

8. A resist pattern forming method according to claim 1, wherein the prebake is a heating treatment carried out at 90°–110° C. for 30–120 seconds.

9. A resist pattern forming method according to claim 8 wherein the photoresist comprises a naphthoquinone diazide photosensitizer.

10. A resist pattern forming method according to claim 1, wherein the photoresist comprises a naphthoquinonediazide photosensitizer.

11. The method as claimed in claim 1 wherein said atmosphere comprises steam and nitrogen in a ratio of 1:4.

12. The method as claimed in claim 1 comprising increasing said water content of said resist an amount sufficient to increase the amount of carboxylic acid groups generated during said radiation step whereby increasing the solubility of said irradiated resist in an alkaline developer.

* * * * *